United States Patent
Yamazaki et al.

(10) Patent No.: US 9,388,506 B2
(45) Date of Patent: Jul. 12, 2016

(54) SEMICONDUCTOR CRYSTAL REMOVAL APPARATUS AND PRODUCTION METHOD FOR SEMICONDUCTOR CRYSTAL

(71) Applicant: TOYODA GOSEI CO., LTD., Kiyosu-shi (JP)

(72) Inventors: Shiro Yamazaki, Kiyosu (JP); Seiji Nagai, Kiyosu (JP); Miki Moriyama, Kiyosu (JP)

(73) Assignee: Toyoda Gosei Co., Ltd., Kiyosu-shi, Aichi-ken (JP)

( * ) Notice: Subject to any disclaimer, the term of this patent is extended or adjusted under 35 U.S.C. 154(b) by 442 days.

(21) Appl. No.: 13/918,721

(22) Filed: Jun. 14, 2013

(65) Prior Publication Data

US 2014/0000509 A1    Jan. 2, 2014

(30) Foreign Application Priority Data

Jun. 27, 2012    (JP) .................................. 2012-143798

(51) Int. Cl.
*C30B 9/00*    (2006.01)
*C30B 9/12*    (2006.01)
*C30B 29/40*    (2006.01)
(Continued)

(52) U.S. Cl.
CPC ................. *C30B 9/12* (2013.01); *C30B 29/403* (2013.01); *C30B 33/00* (2013.01); *C30B 35/002* (2013.01); *C30B 9/02* (2013.01); *C30B 9/04* (2013.01); *Y10T 117/1004* (2015.01); *Y10T 117/1092* (2015.01)

(58) Field of Classification Search
CPC ................. C30B 9/00; C30B 9/02; C30B 9/04
See application file for complete search history.

(56) References Cited

U.S. PATENT DOCUMENTS 3,915,661 A * 10/1975 Vichr ..................... C30B 9/00
                                                                117/56
5,730,528 A *  3/1998 Allison ................. G01K 11/20
                                                                250/459.1
(Continued)

FOREIGN PATENT DOCUMENTS

CN        101370971 A    2/2009
JP        S56-088896 A    7/1981
(Continued)

OTHER PUBLICATIONS

Japanese Office Action dated Jun. 2, 2015 with a partial English translation thereof.

(Continued)

*Primary Examiner* — Robert M Kunemund
(74) *Attorney, Agent, or Firm* — McGinn IP Law Group, PLLC

(57) ABSTRACT

The present invention provides a semiconductor crystal removal apparatus which realizes effective removal of a semiconductor crystal from a crucible through rapid melting of a solidified flux, and a method for producing a semiconductor crystal. The semiconductor crystal removal apparatus includes a crucible support for supporting a crucible so that the opening of the crucible is directed downward; a heater for heating the crucible supported on the crucible support; and a semiconductor crystal receiving net for receiving a semiconductor crystal falling from the opening of the crucible. The semiconductor crystal removal apparatus further includes a determination portion for determining removal of the semiconductor crystal on the basis of a change in weight through falling of the semiconductor crystal.

8 Claims, 5 Drawing Sheets

(51) Int. Cl.
*C30B 33/00* (2006.01)
*C30B 35/00* (2006.01)
*C30B 9/02* (2006.01)
*C30B 9/04* (2006.01)

(56) References Cited

U.S. PATENT DOCUMENTS 8,730,563 B2 * 5/2014 Pan .......................... C30B 9/06
359/326
2008/0302297 A1 12/2008 Ichimura et al.

FOREIGN PATENT DOCUMENTS

| JP | H07-309691 A | 11/1995 |
| JP | 2010-269967 A | 12/2010 |
| JP | 2010-269986 A | 12/2010 |

OTHER PUBLICATIONS

Chinese Office Action dated Jun. 3, 2015 with an English translation thereof.

* cited by examiner

SEMICONDUCTOR CRYSTAL REMOVAL APPARATUS AND PRODUCTION METHOD FOR SEMICONDUCTOR CRYSTAL

BACKGROUND OF THE INVENTION

1. Field of the Invention

The present invention relates to an apparatus for removing a semiconductor crystal (hereinafter may be referred to as a "semiconductor crystal removal apparatus"), and to a method for producing a semiconductor crystal. More particularly, the present invention relates to a semiconductor crystal removal apparatus in which a semiconductor crystal is removed from a crucible, and to a method for producing a semiconductor crystal.

2. Background Art

Semiconductor crystal production methods include vapor-phase growth methods such as metal-organic chemical vapor deposition (MOCVD) and hydride vapor phase epitaxy (HVPE); molecular beam epitaxy (MBE); and liquid-phase epitaxy. The flux process employing Na flux is a type of liquid-phase epitaxy.

In the flux process, generally, a GaN layer is formed on, for example, a sapphire substrate, to thereby prepare a seed crystal substrate, and a semiconductor single-crystal is grown on the seed crystal substrate in a flux. In this case, the seed crystal substrate, the flux, and a raw material of the semiconductor single-crystal are placed in a crucible, and then the semiconductor single-crystal is grown while temperature and pressure are controlled inside a reaction chamber. Thereafter, the temperature of the reaction chamber is lowered to room temperature. Thus, the flux is solidified through cooling of the reaction chamber to room temperature.

Generally, ethanol treatment or the like is carried out for removing the semiconductor single-crystal from the solidified flux. However, a very long period of time is required for separating the semiconductor single-crystal from the solidified flux through dissolution of the flux by ethanol treatment or the like. Therefore, there has been disclosed a technique in which a crucible is inclined in the interior of a treatment vessel (see FIG. 1, etc. of Patent Document 1). The patent document describes that this technique promotes discharge of hydrogen gas, which would otherwise inhibit ethanol treatment or the like, and enables ethanol treatment or the like to be effectively performed between a semiconductor single-crystal and a flux.

Patent Document 1: Japanese Patent Application Laid-Open (kokai) No. 2010-269967

However, even when the crucible is inclined in the treatment vessel as described in Patent Document 1, the fact remains that the solidified flux is gradually dissolved by a hydroxyl-group-containing treatment liquid such as ethanol; i.e., a long period of time is required for ethanol treatment. In addition, separation of the semiconductor single-crystal from the flux cannot be determined through the aforementioned technique. Therefore, an appropriate operation is required for determining whether or not the semiconductor single-crystal has been separated from the flux.

SUMMARY OF THE INVENTION

The present invention has been accomplished for solving the aforementioned problems involved in conventional techniques. Accordingly, an object of the present invention is to provide a semiconductor single-crystal removal apparatus which realizes effective removal of a semiconductor single-crystal from a crucible through rapid melting of a solidified flux. Another object of the present invention is to provide a method for producing a semiconductor single-crystal.

In a first aspect of the present invention, there is provided a semiconductor crystal removal apparatus for removing a Group III nitride semiconductor crystal from a crucible, the crystal having been produced in the crucible through the flux process. The semiconductor crystal removal apparatus comprises a crucible-supporting unit for supporting the crucible so that the opening of the crucible is directed downward; a heating unit for heating the crucible supported by means of the crucible-supporting unit; and a semiconductor crystal-receiving unit for receiving the semiconductor crystal falling from the opening of the crucible.

In the semiconductor crystal removal apparatus, a flux can be melted by heating the flux. Therefore, treatment time is shortened, and cycle time is also shortened. Since the semiconductor crystal falls through melting of the flux, the degree of melting of the flux is not required to be appropriately determined. This is because the semiconductor crystal must be present on the semiconductor crystal-receiving unit after completion of removal of the semiconductor crystal from the crucible.

A second aspect of the present invention is drawn to a specific embodiment of the semiconductor crystal removal apparatus, which further comprises a weight-measuring unit for measuring the weight of the crucible-supporting unit or the semiconductor crystal-receiving unit; and a determination portion for determining whether or not the semiconductor crystal has been removed from the crucible. The determination portion determines that the semiconductor crystal has been already removed from the crucible when a change in weight as measured by means of the weight-measuring unit is equal to or greater than a predetermined threshold, or determines that the semiconductor crystal has not yet been removed from the crucible when a change in weight as measured by means of the weight measuring unit is less than the predetermined threshold. Therefore, there can be determined whether or not removal of the semiconductor crystal from the crucible has been completed. In addition, a notice of completion of removal of the semiconductor crystal can be displayed to the operator, etc.

A third aspect of the present invention is drawn to a specific embodiment of the semiconductor crystal removal apparatus, which further comprises a miscellaneous crystal-receiving unit for receiving miscellaneous crystals contained in the flux, the unit being located below the semiconductor crystal-receiving unit. Na can be recovered through removal of miscellaneous crystals from the flux. The thus-recovered Na can be recycled for production of a semiconductor crystal.

A fourth aspect of the present invention is drawn to a specific embodiment of the semiconductor crystal removal apparatus, wherein the semiconductor crystal-receiving unit is formed of a net having a shape convex toward a position at which the crucible is provided. Since the distance between the crucible and the semiconductor crystal falling therefrom can be reduced, breakage of the semiconductor crystal can be suppressed.

A fifth aspect of the present invention is drawn to a specific embodiment of the semiconductor crystal removal apparatus, which further comprises a pipe for causing a molten flux to flow therethrough, and an Na storage unit for storing the molten flux. This configuration is suitable for recovery of Na flux.

In a sixth aspect of the present invention, there is provided a method for producing a semiconductor crystal, the method comprising a seed crystal substrate preparation step of forming a semiconductor layer on a substrate, to thereby prepare a seed crystal substrate; a semiconductor single-crystal growth step of placing the seed crystal substrate, a flux, and a raw material in a crucible, and growing a Group III nitride semiconductor crystal while rotating the crucible; and a semiconductor crystal removal step of removing the semiconductor crystal from the crucible. In the semiconductor crystal removal step, the flux is melted by heating the crucible while the opening of the crucible is directed downward, and the semiconductor crystal, which falls through melting of the flux, is received by means of a net-form receiving member. In the semiconductor crystal production method, the semiconductor crystal removal step is carried out within a short period of time; i.e., cycle time is shortened.

A seventh aspect of the present invention is drawn to a specific embodiment of the semiconductor crystal production method, wherein, in the semiconductor crystal removal step, removal of the semiconductor crystal is determined by measuring a change in load of the crucible or the receiving member. Therefore, there can be determined whether or not removal of the semiconductor crystal from the crucible has been completed. In addition, a notice of completion of removal of the semiconductor crystal can be displayed to the operator, etc.

According to the present invention, there are provided a semiconductor crystal removal apparatus which realizes effective removal of a semiconductor crystal from a crucible through rapid melting of a solidified flux, and a method for producing a semiconductor crystal.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

Figure 1:
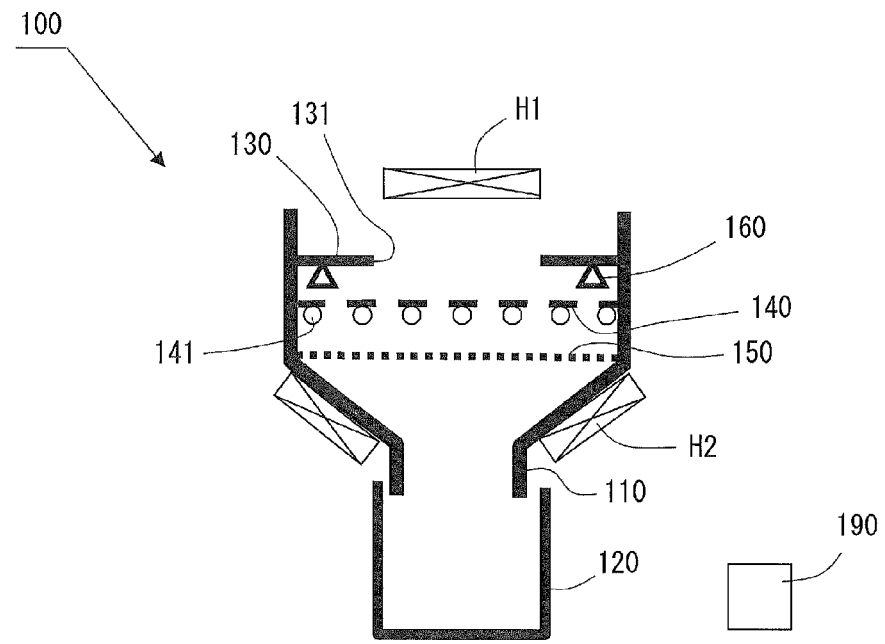
FIG. 1 shows the structure of a semiconductor single-crystal removal apparatus according to an embodiment (part 1)

Specific embodiments of the present invention will next be described with reference to the drawings. The embodiments relate to a semiconductor single-crystal removal apparatus for removing a Group III nitride-based compound semiconductor single-crystal produced through the flux process, and to a method for producing a semiconductor single-crystal. The apparatus and method described in these embodiments are only an example, and the present invention is not limited to the embodiments. The thickness of each layer which is schematically shown in the drawings does not correspond to its actual value.

Embodiment 1

1. Semiconductor Single-Crystal Removal Apparatus

FIG. 1 shows a semiconductor single-crystal removal apparatus 100 according to the present embodiment. The semiconductor single-crystal removal apparatus 100 realizes effective removal of a semiconductor single-crystal grown in a crucible through the flux process. In the apparatus, a solidified flux is melted by means of a heating system. In the apparatus, the crucible is provided so that the opening thereof is directed downward; i.e., the crucible is provided upside down.

As shown in FIG. 1, the semiconductor single-crystal removal apparatus 100 includes a pipe 110; an Na reservoir 120; a crucible support 130; a semiconductor single-crystal receiving net 140; a miscellaneous crystal receiving net 150; a weight sensor 160; a heater H1; a heater H2; a heater 141; and a determination portion 190.

The pipe 110 and the Na reservoir 120 are separated from each other. A molten flux (Na flux) flows from the crucible through the pipe 110. The heater H2 functions to heat the pipe 110. Through heating of the pipe 110, the flowing Na flux does not solidify, and falls into the Na reservoir 120. The Na reservoir 120 functions to receive and reserve the flowing Na flux. The Na reservoir 120 serves as an Na storage unit for at least temporarily storing the molten flux.

The crucible employed is placed on the crucible support 130. The crucible itself is not a component of the semiconductor single-crystal removal apparatus 100. As described above, the crucible is provided upside down. The crucible support 130 has a through-hole 131 therein. The through-hole 131 is provided so as not to prevent falling of a semiconductor single-crystal. The crucible support 130 serves as a crucible-supporting unit for supporting the crucible so that the opening of the crucible is directed downward. With this configuration, removal of a GaN single-crystal C10 from the crucible opening is not prevented.

The semiconductor single-crystal receiving net 140 serves as a semiconductor single-crystal-receiving unit for receiving a semiconductor single-crystal which falls, from the opening of the crucible, as a result of melting of the flux. The semiconductor single-crystal receiving net 140 has a relatively coarse mesh. Specifically, the semiconductor single-crystal receiving net 140 has a mesh size smaller than the size of the semiconductor single-crystal, and greater than the size of other miscellaneous crystals; i.e., the semiconductor single-crystal receiving net 140 has such a coarse mesh that it receives the semiconductor single-crystal, but does not receive other miscellaneous crystals. Needless to say, the Na flux falls downward without being prevented from flowing by the semiconductor single-crystal receiving net 140. The distance between the crucible support 130 and the semiconductor single-crystal receiving net 140 is, for example, about 2 to about 7 cm. The distance may be 0 cm. In this case, the semiconductor single-crystal receiving net 140 also serves as the crucible support, and a decrease in amount of the Na flux may be determined by means of the weight sensor 160.

The semiconductor single-crystal receiving net 140 is provided with the line heater 141. Thus, the semiconductor single-crystal receiving net 140 is heated by means of the heater 141. In the case where a semiconductor single-crystal falls downward while a solidified flux is deposited on the periphery of the semiconductor single-crystal, when the semiconductor single-crystal receiving net 140 is heated by means of the heater 141, the solidified flux at the periphery of the semiconductor single-crystal is melted, whereby the melted flux falls downward.

The miscellaneous crystal receiving net 150 functions to remove miscellaneous crystals from the falling flux. The miscellaneous crystal receiving net 150 has a relatively fine mesh. No particular limitation is imposed on the miscellaneous crystal receiving net 150, so long as it has a mesh size smaller than the size of miscellaneous crystals. Miscellaneous crystals have a size of about 1 mm to about 2 mm. Therefore, the miscellaneous crystal receiving net 150 has a mesh size of 1 mm or less.

The weight sensor 160 serves as a weight-measuring unit for monitoring a change in weight of the crucible. Actually, the weight sensor 160 measures the weight of the crucible support 130. After the crucible has been placed in the semiconductor single-crystal removal apparatus 100, the weight sensor 160 measures a change in weight of the crucible. When the semiconductor single-crystal falls from the crucible, the weight as measured by means of the weight sensor 160 is reduced commensurate with the mass of the semiconductor single-crystal. Thus, removal of the semiconductor single-crystal from the crucible can be determined.

The heater H1 serves as a heating unit for heating the crucible placed on the crucible support 130. That is, the crucible 1 is heated while the opening thereof is directed downward. The heater H1 is provided at a position which faces the bottom surface of the crucible when the crucible is placed on the crucible support. The heater H1 is, for example, a hot plate. The heater H1 may be another heating system. The heater H1 heats the crucible at a temperature of 100° C. to 200° C. Since the Na flux has a melting point of lower than 100° C. (about 98° C.), the crucible is maintained at a temperature equal to or higher than the melting point. That is, the semiconductor single-crystal is removed from the crucible by melting the flux contained in the crucible through heating by means of the heater H1.

The heater H2 functions to heat the pipe 110; i.e., the heater H2 is employed for preventing solidification of the Na flux when it flows along the inner wall of the pipe 110. Therefore, the pipe 110 is heated at about 100° C. The heater H2 may be the same as or different from the heater H1.

The determination portion 190 functions to determine whether or not the semiconductor single-crystal has been removed from the crucible. The determination portion 190 is employed for monitoring a change in weight of the crucible support 130 by means of the weight sensor 160. The determination portion 190 determines that the semiconductor single-crystal has been already removed from the crucible when a change in weight of the crucible support 130 is equal to or greater than a predetermined threshold. Meanwhile, the determination portion 190 determines that the semiconductor single-crystal has not yet been removed from the crucible when a change in weight of the crucible support 130 is less than the predetermined threshold. As used herein, the expression "a change in weight of the crucible support 130" refers to the absolute value of the change in weight with respect to the initial weight of the crucible support 130 on which the crucible has been placed.

2. Semiconductor Crystal Removal Method

Next will be described a semiconductor single-crystal removal method employing the semiconductor single-crystal removal apparatus 100 according to the present embodiment. As described hereinbelow, the semiconductor single-crystal removal method is carried out in the semiconductor single-crystal removal step of a semiconductor single-crystal production method. In the semiconductor single-crystal removal method, a solidified flux is melted through heating. Therefore, the time until removal of a semiconductor single-crystal is shortened, as compared with the case of a conventional method employing treatment with ethanol, etc.

2-1. Semiconductor Crystal Before Removal

Figure 2:
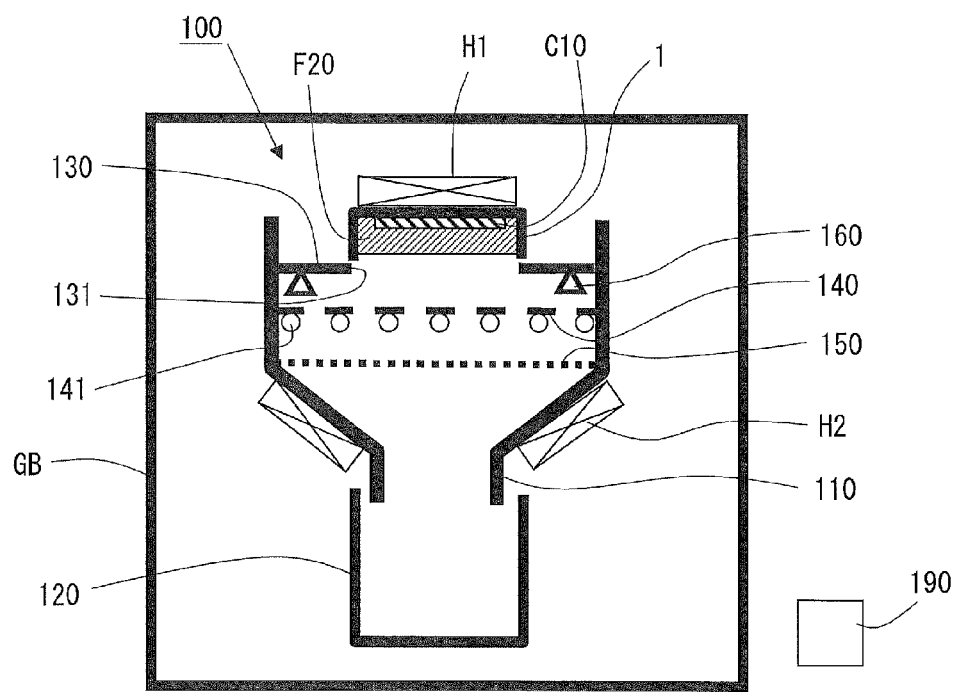
FIG. 2 illustrates a semiconductor single-crystal removal method by means of the semiconductor single-crystal removal apparatus according to the embodiment (part 1)

Now will be described a crucible and a semiconductor single-crystal before description of the semiconductor single-crystal removal method. As shown in FIG. 2, a GaN single-crystal C10 is grown in a crucible 1. Needless to say, the GaN single-crystal C10 is a semiconductor single-crystal. As shown in FIG. 2, even when the crucible 1 is provided upside down, the GaN single-crystal C10 and a flux F20 do not fall downward, since the GaN single-crystal C10 is fixed to the interior of the crucible 1 by means of the solidified flux F20.

2-2. Removal Method 2-2-1. Placement Step

In this step, as shown in FIG. 2, operation is carried out in a glove box GB. Firstly, the crucible 1 containing the GaN single-crystal C10 is placed on the semiconductor single-crystal removal apparatus 100. In this case, the crucible 1 is placed on the crucible support 130 so that the crucible 1 is provided upside down; i.e., the opening of the crucible 1 is directed downward. The opening of the crucible 1 faces the through-hole 131. If the flux is not solidified, the flux F20 and the GaN single-crystal C10 fall downward. However, actually, the flux F20 is solidified, and both the flux F20 and the GaN single-crystal C10 are fixed to the interior of the crucible 1. Therefore, neither the flux F20 nor the GaN single-crystal C10 falls downward.

2-2-2. Heating/Melting Step

Subsequently, while the crucible 1 is placed on the crucible support 130, the heater H1 is turned on. In this case, the temperature of the crucible 1 is adjusted to fall within a range of 100° C. to 200° C. Thus, the flux F20 contained in the crucible 1 begins to melt, and the thus-melted flux gradually falls downward through the pipe 110.

The melted flux F20 contains therein miscellaneous crystals. The miscellaneous crystals have a size of about 1 mm to about 2 mm. The flux F20 containing the miscellaneous crystals passes through the semiconductor single-crystal receiving net 140. The miscellaneous crystals are not removed from the melted flux F20 by the semiconductor single-crystal receiving net 140, but are removed from the melted flux F20 by means of the miscellaneous crystal receiving net 150. The Na flux from which the miscellaneous crystals have been removed flows through the pipe 110, and accumulates in the Na reservoir 120. The flux accumulated in the Na reservoir 120 may be recycled for subsequent production of a GaN single-crystal C10.

Figure 3:
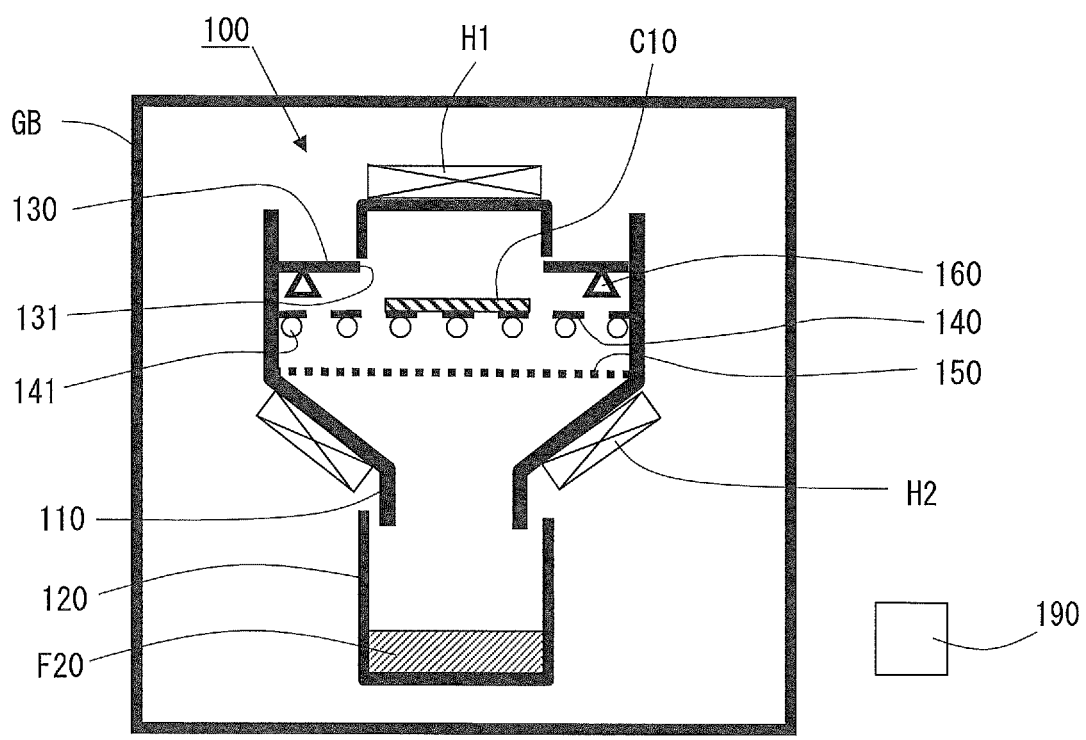
FIG. 3 illustrates the semiconductor single-crystal removal method by means of the semiconductor single-crystal removal apparatus according to the embodiment (part 2)

Thus, the flux F20 is gradually melted. Then, the flux F20 which is solidified around the GaN single-crystal C10 is also melted. When the flux F20 which fixes the GaN single-crystal C10 to the interior of the crucible 1 is melted to some extent, the GaN single-crystal C10 is no longer supported by the flux, whereby the GaN single-crystal C10 falls downward through the pipe 110. Then, as shown in FIG. 3, the falling GaN single-crystal C10 is received by means of the single-crystal receiving net 140.

The weight sensor 160 determines that the weight of the crucible 1 placed on the crucible support 130 is reduced; i.e., the GaN single-crystal C10 falls downward. The determination portion 190 determines that the GaN single-crystal C10 has fallen downward when a change in weight as measured by means of the weight sensor 160 is equal to or greater than a predetermined threshold. Meanwhile, the determination portion 190 determines that the GaN single-crystal C10 has not yet fallen downward when a change in weight as measured by means of the weight sensor 160 is less than the predetermined threshold. Thus, completion of removal of the GaN single-crystal C10 can be determined by determining falling of the GaN single-crystal C10.

Even after falling of the GaN single-crystal C10, the flux F20 containing the miscellaneous crystals still continues to fall downward. The flux F20 from which the miscellaneous crystals have been removed accumulates in the Na reservoir 120. In order to recycle the flux F20 and to secure operational safety, preferably, heating of the crucible 1 is completed after the flux F20 has been almost completely recovered in the Na reservoir 120. Recovery of the flux may be determined by means of the determination portion 190, which monitors a change in weight as measured by the weight sensor 160. Thus, removal of the GaN single-crystal C10 from the crucible 1 is completed.

The time required for removal of the GaN single-crystal C10 from the crucible 1 through the aforementioned method is about three hours. When conventional ethanol treatment is employed, the aforementioned operation requires about 10 hours.

3. Production Method for Group III Nitride Semiconductor Crystal

Now will be described a method for producing a semiconductor crystal. A characteristic feature of the semiconductor crystal production method resides in that the method employs the aforementioned semiconductor crystal removal method.

3-1. Seed Crystal Substrate Preparation Step

Figure 4:
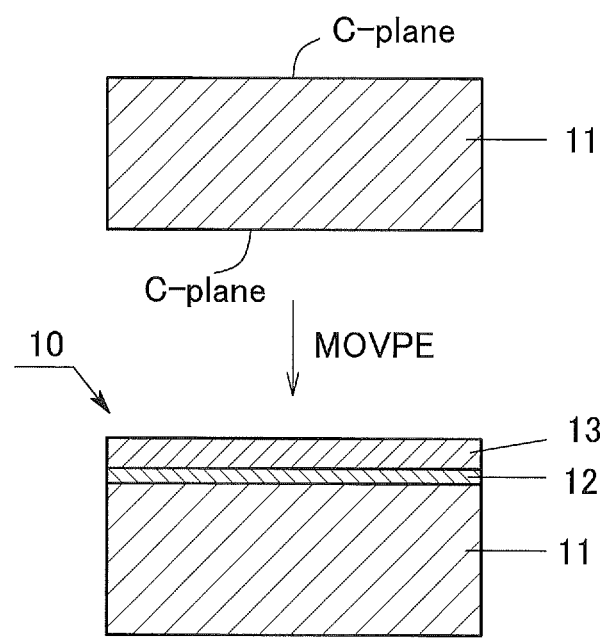
FIG. 4 shows a production process of a semiconductor single-crystal production method according to the embodiment (part 1)

Now will be described a step of preparing a template 10 shown in FIG. 4. The template 10 is a seed crystal substrate employed for growing a semiconductor single-crystal through the flux process. Firstly, a sapphire substrate 11 is provided. Then, a buffer layer 12 is formed on the c-plane surface of the sapphire substrate 11 through MOCVD. The buffer layer 12 is formed of, for example, AlN. The buffer layer 12 may be formed of GaN. Subsequently, a GaN layer 13 is formed on the buffer layer 12, to thereby prepare the template 10.

The GaN layer 13 undergoes melt back in the flux; i.e., a portion of the GaN layer 13 dissolves in the flux. The remaining portion of the GaN layer 13 does not dissolve in the flux, but remains on the sapphire substrate 11.

3-2. Semiconductor Crystal Growth Step

Figure 5:
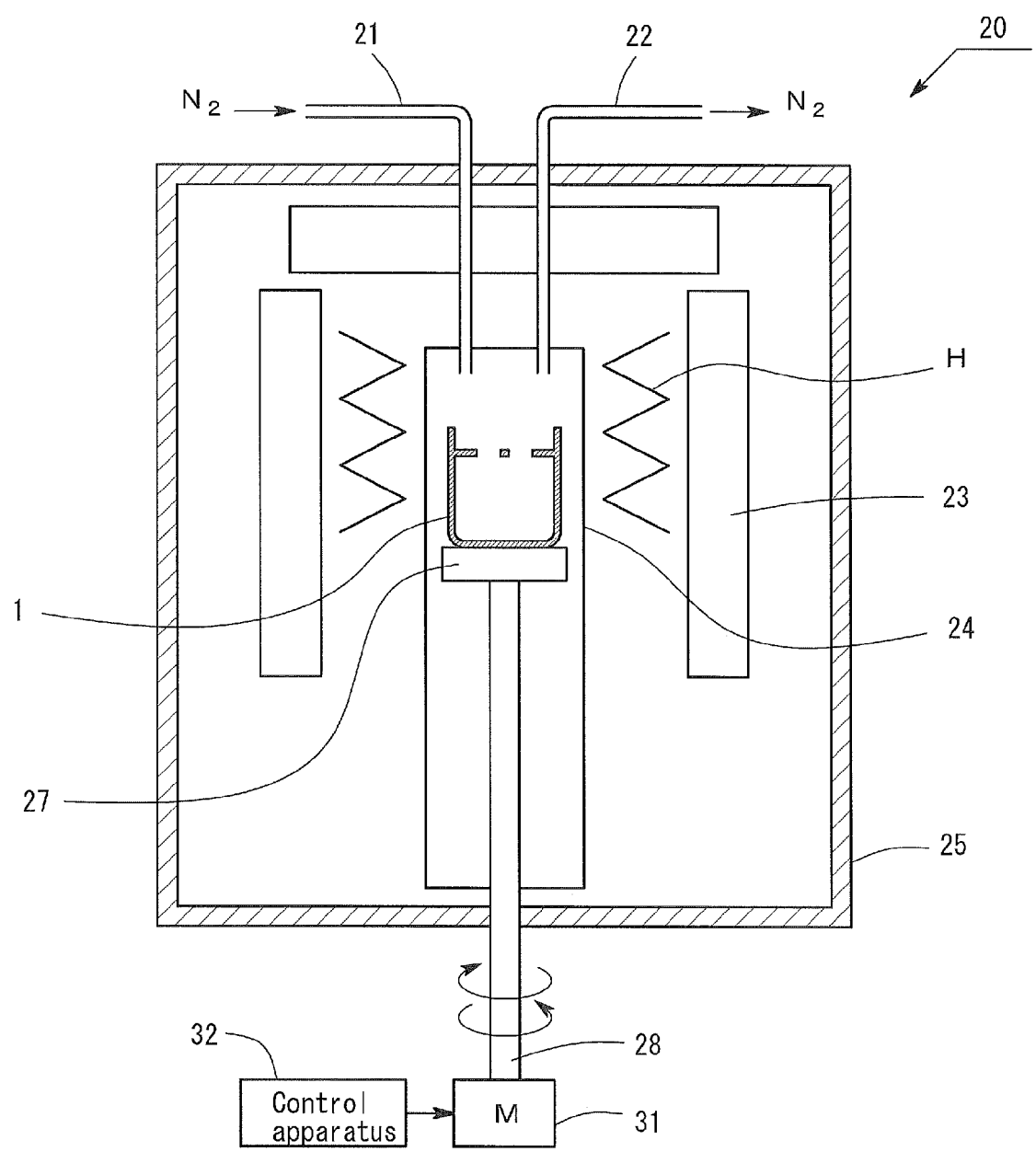
FIG. 5 shows a production process of the semiconductor single-crystal production method according to the embodiment (part 2)

Next, a GaN single-crystal C10 is grown on the template 10 through the flux process, which is a type of liquid-phase epitaxy. Growth of the crystal is carried out by means of a semiconductor single-crystal production apparatus 20 shown in FIG. 5. The semiconductor single-crystal production apparatus 20 is configured so that a crucible 1 can be heated by means of a heater H while the crucible 1 is rotated on a turntable 27 of a reaction chamber 24 in the interior of a pressure container 25. $N_2$ gas can be fed into the crucible 1.

Table 1 shows raw materials employed for growth of the semiconductor single-crystal. The Ga content is preferably adjusted to 30% or less. The carbon content may vary within a range of 0 mol % to 2.0 mol %. That is, the flux may optionally contain carbon. However, the carbon content is more preferably 0.01 mol % to 2.0 mol %. The values shown in Table 1 are only an example, and other values may be applied.

Firstly, the template 10 and the raw materials shown in Table 1 are weighed in a glove box in which dew point and oxygen concentration are controlled. The values shown in Table 1 are only an example, and different values may be applied. Subsequently, the template 10, the raw materials, and the flux are placed on the crucible 1. Then, the crucible 1 is placed in the turntable 27 of the reaction chamber 24. There-after, the pressure container 25 is evacuated, and then the pressure and temperature in the container are elevated. While the crucible 1 is rotated, a semiconductor single-crystal is grown.

TABLE 1

| Ga | 20 g to 80 g |
|----|--------------|
| Na | 20 g to 80 g |
| C  | 0.1 mol % to 2.0 mol % (with respect to Na) |

Table 2 shows conditions in the crucible employed for the semiconductor single-crystal growth step. The temperature is adjusted to 870° C., and the pressure is adjusted to 3 MPa. The inner diameter of the crucible 1 is, for example, 60 mm. In this case, the rotation speed of the crucible 1 is adjusted to 50 rpm. The growth time is adjusted to 100 hours. These conditions are only an example, and the GaN single-crystal C10 may be grown under conditions different from the aforementioned ones.

TABLE 2

| Temperature | 850° C. to 900° C. |
|-------------|---------------------|
| Pressure | 3 MPa to 10 MPa |
| Stirring speed | 0 rpm to 100 rpm |
| Growth time | 20 hours to 200 hours |

In the semiconductor single-crystal growth step, at least a portion of the GaN layer 13 of the template 10 dissolves through melt back. A GaN single-crystal is grown from the melt-backed GaN layer 13 after saturation of the flux. After the elapse of the specific growth time, the flat GaN single-crystal C10 is formed.

3-3. Semiconductor Crystal Removal Step

Subsequently, as described above, the GaN single-crystal C10 is removed from the crucible 1 by means of the semiconductor single-crystal removal apparatus 100. Thus, the GaN single-crystal C10 is produced. Thereafter, preferably, the surface of the GaN single-crystal C10, etc. are washed. When the determination portion 190 determines that removal of the GaN single-crystal C10 has been completed, a notice of completion of the removal may be displayed to the operator, etc.

4. Modification 4-1. Position of Weight Sensor

In the present embodiment, the weight sensor 160 is provided at a position below the crucible support 130 so as to monitor the weight of the crucible support 130. However, the weight sensor may be employed for monitoring the weight of the semiconductor single-crystal receiving net 140, rather than the weight of the crucible support 130.

In such a case, the semiconductor single-crystal receiving net 140 receives the GaN single-crystal C10, and thus the weight of the semiconductor single-crystal receiving net 140 increases; i.e., the weight of the net 140 increases commensurate with the weight of the GaN single-crystal C10. Therefore, when a change in weight of the net 140 is equal to or greater than a predetermined threshold, it is determined that the GaN single-crystal C10 has been removed from the crucible 1, whereas when a change in weight of the net 140 is less than the predetermined threshold, it is determined that the GaN single-crystal C10 has not yet been removed from the crucible 1.

4-2. Two-Stage Arrangement of Miscellaneous Crystal Receiving Nets

In the present embodiment, only one miscellaneous crystal receiving net 150 is provided below the semiconductor single-crystal receiving net 140. However, two or more miscellaneous crystal receiving nets having different mesh sizes may be provided. Needless to say, a miscellaneous crystal receiving net having a smaller mesh size is provided at a position nearer to the pipe 110. With this configuration, Na flux containing virtually no miscellaneous crystals can be recovered.

4-3. Inclination of Crucible Support

In the present embodiment, the crucible support 130 is generally horizontally provided. However, the crucible support 130 may be provided so as to be inclined to some extent. For example, the crucible support 130 may be inclined by 0° to 30° with respect to the horizontal direction. This is because, even in the case where the crucible support 130 is inclined, when the crucible 1 is provided so that the opening thereof is directed generally downward, the GaN single-crystal C10 can be removed from the crucible 1.

The expression "the opening of the crucible 1 is directed downward" encompasses the case where the opening of the crucible 1 is directed in a direction inclined by ±30° with respect to the vertically downward direction (not to mention the case where the opening is directed in the vertically downward direction).

4-4. Crucible Holding Unit

In the present embodiment, the crucible 1 is provided upside down on the crucible support 130. However, another mechanism may be employed, so long as the crucible 1 is held so that the opening thereof is directed downward. For example, a holding member which holds the crucible 1 on both sides may be employed. That is, this holding member serves as a crucible-supporting unit for supporting the crucible 1 so that the opening of the crucible 1 is directed downward.

4-5. Group III Nitride Semiconductor Crystal

In the present embodiment, a GaN semiconductor single-crystal is produced. However, the apparatus of the present invention may be applied to production of another Group III nitride semiconductor single-crystal; specifically, $Al_X In_Y Ga_{(1-X-Y)}N$ ($0 \leq X$, $0 \leq Y$, $X+Y \leq 1$). In such a case, raw materials corresponding to the Group III nitride semiconductor single-crystal must be fed into the crucible 1.

5. Summary of the Present Embodiment

As described above in detail, the semiconductor single-crystal removal apparatus 100 of the present embodiment includes the crucible support 130 for supporting the crucible 1 so that the opening of the crucible 1 is directed downward; the heater H1 for heating the thus-supported crucible 1; and the semiconductor single-crystal receiving net 140 for receiving the falling semiconductor single-crystal C10. Therefore, the semiconductor single-crystal C10 can be removed from the crucible 1 through heating of the crucible 1 by means of the heater H1.

Since the solidified flux is melted through heating, the time until removal of the semiconductor single-crystal C10 is shortened; i.e., cycle time is shortened. In addition, since the apparatus includes the weight sensor 160 and the determination portion 190, a change in weight through falling of the semiconductor single-crystal C10 can be determined, and completion of removal of the semiconductor single-crystal C10 can be determined. Thus, the semiconductor single-crystal removal apparatus 100 and the semiconductor single-crystal production method realize removal of the semiconductor single-crystal C10 from the crucible 1 within a short period of time, as well as determination of completion of removal of the semiconductor single-crystal C10.

The present embodiment is only an example. Therefore, needless to say, various modifications and variations may be made in the present invention without departing from the scope of the invention. For example, in the present embodiment, metal-organic chemical vapor deposition (MOCVD) is employed for forming the buffer layer 12 and the GaN layer 13 of the template 10. However, there may be employed any other growth method; for example, a vapor-phase growth method such as hydride vapor phase epitaxy (HVPE), or molecular beam epitaxy (MBE). Although the sapphire substrate 11 is employed in the present embodiment, another substrate such as a GaN substrate may be employed.

Embodiment 2

Embodiment 2 will now be described. The structure of the semiconductor single-crystal removal apparatus of the present embodiment partially differs from that of the semiconductor single-crystal removal apparatus of Embodiment 1. Therefore, the semiconductor single-crystal removal apparatus of the present embodiment will be described by focusing only on the different portion.

1. Semiconductor Single-Crystal Removal Apparatus

Figure 6:
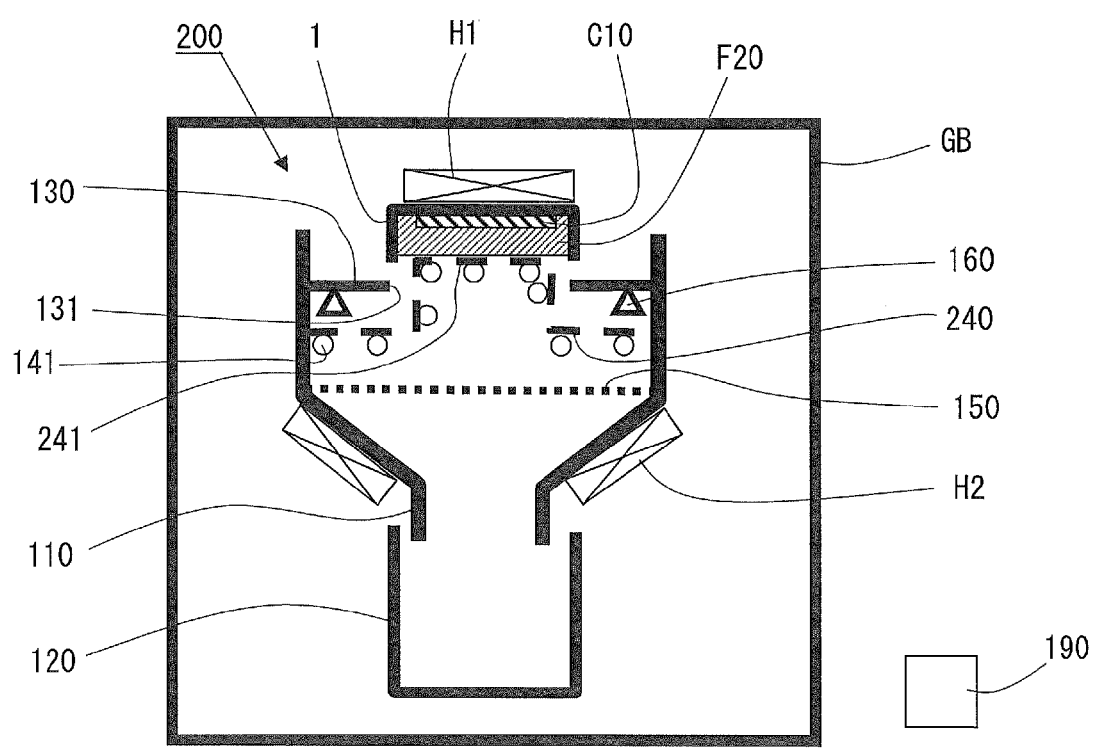
FIG. 6 shows the structure of the semiconductor single-crystal removal apparatus according to the embodiment (part 2).

As shown in FIG. 6, the semiconductor single-crystal removal apparatus 200 includes a pipe 110; an Na reservoir 120; a crucible support 130; a semiconductor single-crystal receiving net 240; a miscellaneous crystal receiving net 150; a weight sensor 160; a heater H1; a heater H2; and a determination portion 190. In the semiconductor single-crystal removal apparatus 200, the shape of the semiconductor single-crystal receiving net 240 and the heater for melting a flux differ from those of the semiconductor single-crystal removal apparatus 100 of Embodiment 1. That is, the heater H1 may optionally be provided.

The semiconductor single-crystal receiving net 240 serves as a semiconductor single-crystal-receiving unit for receiving a falling semiconductor single-crystal C10. As shown in FIG. 6, the semiconductor single-crystal receiving net 240 has an upwardly convex portion 241. The convex portion 241 of the semiconductor single-crystal receiving net 240 is provided in the interior of the crucible 1 through the opening thereof, and is in contact with the flux. Therefore, the flux is heated from the bottom side of the crucible 1 by means of the heater H1, and from the side of the opening of the crucible 1 by means of the heater 141.

The distance between the crucible 1 and the convex portion 241 is reduced, and thus the convex portion 241 functions to prevent breakage of the semiconductor single-crystal C10, which would otherwise occur as a result of falling thereof. The convex portion 241 has a flat region in the vicinity of the top thereof, which is suitable for receiving the semiconductor single-crystal. Preferably, the flat region of the convex portion 241 has a width greater than that of the semiconductor single-crystal.

2. Modification

In the present embodiment, all the modifications described in Embodiment 1 may be applied.

3. Summary of the Present Embodiment

As described above in detail, the semiconductor single-crystal removal apparatus 200 of the present embodiment includes the crucible support 130 for supporting the crucible 1 so that the opening of the crucible 1 is directed downward; the heater H1 for heating the thus-supported crucible 1; and the semiconductor single-crystal receiving net 240 for receiving the falling semiconductor single-crystal C10. Therefore, the semiconductor single-crystal C10 can be removed from the crucible 1 through heating of the crucible 1 by means of the heater H1.

Since the flux is heated, the time until removal of the semiconductor single-crystal C10 is shortened; i.e., cycle time is shortened. In addition, since the apparatus includes the weight sensor 160 and the determination portion 190, a change in weight through falling of the semiconductor single-crystal C10 can be determined, and completion of removal of the semiconductor single-crystal C10 can be determined. Thus, the semiconductor single-crystal removal apparatus 200 and the semiconductor single-crystal production method realize removal of the semiconductor single-crystal C10 from the crucible 1 within a short period of time, as well as determination of completion of removal of the semiconductor single-crystal C10.

The semiconductor single-crystal receiving net 240 has the convex portion 241. Therefore, the falling distance of the semiconductor single-crystal C10 can be shortened, and thus breakage of the removed semiconductor single-crystal C10 can be prevented.

The present embodiment is only an example. Therefore, needless to say, various modifications and variations may be made in the present invention without departing from the scope of the invention. For example, in the present embodiment, metal-organic chemical vapor deposition (MOCVD) is employed for forming the buffer layer 12 and the GaN layer 13 of the template 10. However, there may be employed any other growth method; for example, a vapor-phase growth method such as hydride vapor phase epitaxy (HVPE), or molecular beam epitaxy (MBE). Although the sapphire substrate 11 is employed in the present embodiment, another substrate such as a GaN substrate may be employed.

What is claimed is:

1. A semiconductor crystal removal apparatus for removing a Group III nitride semiconductor crystal from a crucible, the crystal having been produced in the crucible through the flux process, the semiconductor crystal removal apparatus comprising:
    a crucible-supporting unit for supporting the crucible so that an opening of the crucible is directed downward;
    a heating unit for heating the crucible supported by means of the crucible-supporting unit;
    a semiconductor crystal-receiving unit for receiving the semiconductor crystal falling from the opening of the crucible; and
    a miscellaneous crystal-receiving unit for receiving miscellaneous crystals contained in a flux, the miscellaneous crystal-receiving unit being located below the semiconductor crystal-receiving unit.

2. A semiconductor crystal removal apparatus for removing a Group III nitride semiconductor crystal from a crucible, the crystal having been produced in the crucible through the flux process, the semiconductor crystal removal apparatus comprising:
    a crucible-supporting unit for supporting the crucible so that an opening of the crucible is directed downward;
    a heating unit for heating the crucible supported by means of the crucible-supporting unit;
    a semiconductor crystal-receiving unit for receiving the semiconductor crystal falling from the opening of the crucible;
    a miscellaneous crystal-receiving unit for receiving miscellaneous crystals contained in a flux, the miscellaneous crystal-receiving unit being located below the semiconductor crystal-receiving unit;
    a weight-measuring unit for measuring the weight of the crucible-supporting unit or the semiconductor crystal-receiving unit; and
    a determination portion for determining whether or not the semiconductor crystal has been removed from the crucible, wherein the determination portion determines that the semiconductor crystal has been already removed from the crucible when a change in weight as measured by means of the weight-measuring unit is equal to or greater than a predetermined threshold, or determines that the semiconductor crystal has not yet been removed from the crucible when a change in weight as measured by means of the weight measuring unit is less than the predetermined threshold.

3. The semiconductor crystal removal apparatus according to claim 1, wherein the semiconductor crystal-receiving unit is formed of a net having a shape convex toward a position at which the crucible is provided.

4. The semiconductor crystal removal apparatus according to claim 2, wherein the semiconductor crystal-receiving unit is formed of a net having a shape convex toward a position at which the crucible is provided.

5. The semiconductor crystal removal apparatus according to claim 1, which further comprises a pipe for causing a molten flux to flow therethrough, and an Na storage unit for storing the molten flux.

6. The semiconductor crystal removal apparatus according to claim 2, which further comprises a pipe for causing a molten flux to flow therethrough, and an Na storage unit for storing the molten flux.

7. The semiconductor crystal removal apparatus according to claim 3, which further comprises a pipe for causing a molten flux to flow therethrough, and an Na storage unit for storing the molten flux.

8. The semiconductor crystal removal apparatus according to claim 4, which further comprises a pipe for causing a molten flux to flow therethrough, and an Na storage unit for storing the molten flux.

* * * * *